US008221635B2

(12) United States Patent
Hauff

(10) Patent No.: US 8,221,635 B2
(45) Date of Patent: Jul. 17, 2012

(54) PROCESS FOR MULTIPLE PLATINGS AND FINE ETCH ACCURACY ON THE SAME PRINTED WIRING BOARD

(75) Inventor: John W. Hauff, Marlborough, MA (US)

(73) Assignee: Raytheon Company, Waltham, MA (US)

( * ) Notice: Subject to any disclaimer, the term of this patent is extended or adjusted under 35 U.S.C. 154(b) by 358 days.

(21) Appl. No.: 12/712,430

(22) Filed: Feb. 25, 2010

(65) Prior Publication Data

US 2010/0224586 A1 Sep. 9, 2010

Related U.S. Application Data

(60) Provisional application No. 61/157,149, filed on Mar. 3, 2009.

(51) Int. Cl.
*H01B 13/00* (2006.01)
*B44C 1/22* (2006.01)

(52) U.S. Cl. ............... 216/13; 216/41; 216/58; 216/83; 174/258; 174/262

(58) Field of Classification Search .................... 216/13, 216/41, 58, 83; 174/258, 262
See application file for complete search history.

(56) References Cited

U.S. PATENT DOCUMENTS

| 3,634,929 | A | * | 1/1972 | Yoshida et al. | ............... 438/131 |
|---|---|---|---|---|---|
| 4,605,470 | A | * | 8/1986 | Gwozdz et al. | ................ 216/18 |
| 5,926,690 | A | | 7/1999 | Toprac et al. | |
| 6,245,581 | B1 | | 6/2001 | Bonser et al. | |
| 6,486,492 | B1 | | 11/2002 | Su | |
| 6,620,631 | B1 | | 9/2003 | Tao et al. | |
| 6,674,156 | B1 | | 1/2004 | Bayan et al. | |
| 7,094,613 | B2 | | 8/2006 | Mui et al. | |
| 7,583,360 | B2 | | 9/2009 | Fritze et al. | |
| 7,642,793 | B2 | | 1/2010 | Cheng et al. | |
| 2004/0163849 | A1 | * | 8/2004 | Takeuchi et al. | ............... 174/262 |
| 2005/0064714 | A1 | | 3/2005 | Mui et al. | |
| 2006/0000796 | A1 | | 1/2006 | Tan et al. | |
| 2007/0259527 | A1 | | 11/2007 | Chou et al. | |
| 2009/0203217 | A1 | | 8/2009 | Lee et al. | |

* cited by examiner

Primary Examiner — Shamim Ahmed
(74) Attorney, Agent, or Firm — Daly, Crowley, Mofford & Durkee, LLP

(57) ABSTRACT

A process for manufacturing a printed wiring board includes specifying overlapping etches for a first portion of the printed wiring board and a second portion of the printed wiring board, the first portion of the printed wiring board having disposed thereon a printed circuit having at least one dimension critical to printed wiring board operation, etching a first conductor in the first portion of the printed wiring board when a first conductor thickness is a predetermined thickness, completing all plating steps, and etching a second conductor in the second portion of the printed wiring board.

19 Claims, 7 Drawing Sheets

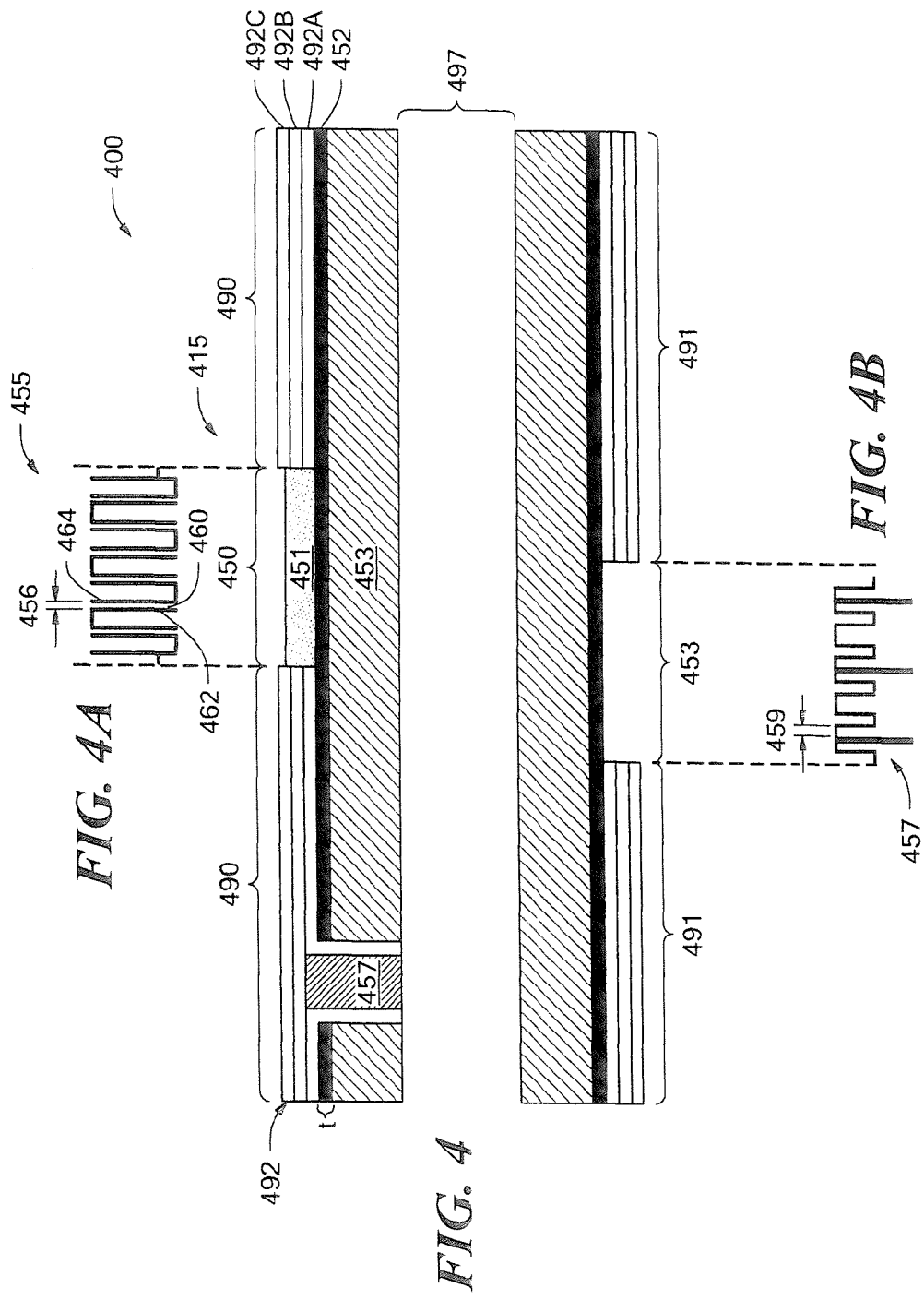

PROCESS FOR MULTIPLE PLATINGS AND FINE ETCH ACCURACY ON THE SAME PRINTED WIRING BOARD

RELATED APPLICATIONS

This application claims the benefit of U.S. Provisional Application No. 61/157,149 filed Mar. 3, 2009 under U.S.C. §119(e) which application is hereby incorporated by reference in its entirety.

FIELD OF THE INVENTION

The structures and techniques described herein relate to printed wiring boards (PWBs) and more particularly to a method for fabricating a radio frequency (RF) circuit on a PWB.

BACKGROUND

As is known in the art, printed wiring boards (PWB) which require multiple plating operations in some areas of the PWB and which have etched circuits with small tolerances consisting of fine lines and/or fine gaps in other areas of the PWB are relatively difficult to fabricate. Similarly, any PWBs having etched circuits or other structures (e.g. hairpin bandpass filter structures) and multiple plating steps are also relatively difficult to fabricate.

To fabricate such PWBs, prior art techniques carefully monitor fabrication/etching processes. Detail prints (i.e. fabrication drawings) define a final top layer plating thickness and also define an etch accuracy for certain top layer board features. Prior art techniques have utilized "plate up then sand down" types of processes to control the final top layer plating thickness everywhere on the PWB surface. While this approach does work, it has yield and reliability issues and is very labor intensive. If too much sanding is done, the PWB can fail an inspection (or tests, e.g. a via plate wrap tests and/or other tests) and be rejected (i.e. deemed not suitable for use in an intended application). On the other hand, if not enough sanding is done, the PWB can fail etch accuracy and maximum plating thickness tests and once again be rejected. As a result, a manufacturer (such as a fabrication or assembly house) may have to procure and produce additional duplicate PWBs in order to deliver one PWB which passes all inspections/tests and meets all of a purchaser's requirements, including critical operational requirements. PWB's which do not pass the required inspections/tests go unused. This results in wasted PWBs and higher unit cost per PWB.

SUMMARY

In general overview, the systems and techniques described herein are directed to a process for manufacturing a printed wiring board (PWB) including etching and plating of critical and non-critical portions of a PWB. Critical portions of the PWB are defined as those portions having disposed thereon printed circuits having one or more dimensions critical to PWB operation. The dimensions may be trace width, trace-to-trace width, or trace thickness dimensions etched on the PWB. In some embodiments, conductors which form printed circuits on the PWB have a predetermined thickness of about 0.7 mils and are etched to a desired width with an accuracy in the range of about +/−0.5 mils. Remaining board features are etched after all board plating steps have been completed. At this point, with a typical plating thickness of 3.5-4.5 mils, etch accuracy would be difficult to hold at anything much tighter than +/−2 to 3 mils, however, in these non-critical portions where trace-to-trace gaps are wider than roughly 10 mils the etch accuracy requirements can be relaxed with no impediment to PWB operation.

The process described herein allows fabrication of circuits on the critical portions of the PWB to desired tight tolerances while at the same time allowing relaxed tolerances to be achieved in the noncritical portions of the PWB. Thus, the technique described herein eliminates the dependence between plating thickness and conductor line width, line gap and/or thickness in critical areas of the PWB. The process can be applied to features etched in an outermost layer of a PWB. In some embodiments, such features do not electrically connect to features on any other layer of the PWB. Electrical interconnections (or more simply "interconnects") between etched features on the critical and non-critical portions of the PWB can be completed either during PWB fabrication or at an assembly house with a number of different methods such as metal sputtering, simple wires, or silver ribbons.

The techniques described herein lead to a process which can be used to fabricate PWBs requiring multiple plating operations in some areas of a PWB while having critical etching requirements (e.g. conductors which require width, gaps and thicknesses with very tight tolerances) in other areas of the PWB, wherein the two areas do not overlap (i.e., the two areas do not electrically connect). The techniques can thus be used to fabricate PWBs having fine line etch and space requirements and multiple plating steps. For example, the techniques described herein can be used to fabricate PWBs having fine line printed circuits critical to PWB operation including, but not limited to, low-pass filters, band-pass filters including, but not limited to, capacitive gap filters, parallel coupled filters, interdigital filters and stub band-pass filters, and high-pass filters. In some embodiments, fine line printed circuits include hairpin band-pass filter structures and/or radio-frequency (RF) edge-coupled filter structures.

The techniques described herein allow PWBs to utilize multiple technologies for via plating and filling, and multiple lamination steps, while at the same time also allowing highly accurate etching and plating processes to take place in critical areas (e.g. those areas of the PWB on which are fabricated RF printed filter circuits). Such critical areas of a PWB can be pre-tested for performance prior to populating the PWB with lumped element circuits or packaged (or packageless) circuits or devices (i.e. the PWB can be tested for performance at the bare board level to validate operation prior to stuffing/populating the PWB with relatively expensive circuit components such as lumped element circuits and/or packaged devices).

This is in contrast to conventional approaches in which a PWB is completely populated with circuit components and devices and then tested as a whole (e.g. as a completed circuit board assembly). Thus, when prior art techniques are used, if a PWB includes an underlying printed circuit which is not etched correctly, there is no practical method for reworking the PWB. As a result, PWB manufacturers may need to scrap an entire populated circuit board which is costly, inefficient, and wasteful. This is particularly true in a production environment.

One feature of the approach described herein is the use of multiple photo masks (also referred to as artwork) to define all features on an outermost layer of a PWB. For example, in one embodiment, two overlapping photo masks are used. Thus, the technique described herein eliminates the classical opposing interdependence between etch accuracy and overall plating thickness.

Another feature of the approach described herein is the ability to satisfy a requirement for critical and non-critical etched areas of the PWB to not be electrically connected to each other on the outermost PWB layer. Thus, the techniques described herein eliminate the associated problem of uncontrolled etching that occurs in at region between the high and low plating areas of the PWB (a so-called "step" region). Such an uncontrolled etching problem can occur when a photo-applied etch resist "sags over" the different plating heights in the step region and can result in a distorted final etched pattern that is difficult, if not impossible, to control.

The approach described herein also reduces or eliminates sand-down, or multi-planarization steps used in prior art PWB fabrication techniques to control a final plating thickness on the PWB. Use of multiple planarization steps are required in the prior art to attempt to achieve fine line etch accuracy in the PWB which can compromise via plating integrity. Thus, the approach described herein reduces or in some cases eliminates process steps, increases yield, and enhances the strength and reliability of via plating at edge wrap regions of a PWB.

In one aspect, a process for manufacturing a PWB includes specifying overlapping etches for first and second portions of the PWB with the first portion of the printed wiring board having disposed thereon a printed circuit having at least one dimension critical to printed wiring board operation. The process further includes etching a first conductor in the first portion of the printed wiring board when a first conductor thickness is a predetermined thickness, completing all plating steps, and etching a second conductor in the second portion of the printed wiring board.

In further embodiments, the process includes one or more of the following features: specifying overlapping etches includes specifying a first etch image corresponding to the first portion and specifying a second etch image corresponding to the second portion; the at least one dimension corresponds to a width of a conductive path of at least a portion of the first conductor; the at least one dimension is typically about 3 mils; the at least one dimension corresponds to a width of a gap formed between at least two conductive paths of the first conductor, the gap extending along at least a portion of the two conductive paths; the at least two conductive paths are parallel; the at least one dimension is typically about 3 mils; the predetermined thickness of the first conductor in the first portion of the printed wiring board is typically about 0.7 mils and the at least one dimension is etched to an accuracy within a range of about +/−0.5 mils; the at least one dimension is typically about 3 mils; the at least one dimension of the printed circuit is etched to a first etch accuracy and the second conductor of the second portion of the printed wiring board is etched to a second etch accuracy less than the first etch accuracy; said etching the first conductor in the first portion of the printed wiring board is completed before said completing all plating steps and said etching a second conductor in the second portion of the printed wiring board is completed after completing all plating steps; said etching the first conductor of the first portion of the printed wiring board is completed after said completing all plating steps and said etching a second conductor of the second portion of the printed wiring board is completed after completing all plating steps; said etching a first conductor of the first portion of the printed wiring board includes applying etch resist to the first conductor, etching the first conductor, and removing etch resist from the first conductor; said completing all plating steps includes applying plate resist to the first conductor of the first portion of the printed wiring board, completing all plating steps, and removing plate resist from the first conductor of the first portion of the printed wiring board, and; the first conductor of the first portion of the printed wiring board forms a radio-frequency edge-coupled filter.

In another aspect, a method of manufacturing a printed wiring board having a conductor disposed on a surface thereof includes defining at least a portion of the printed wiring board as a critical portion of the printed wiring board, the critical portion of the printed wiring board having disposed thereon a first conductor of a predetermined thickness, protecting the critical portion of the printed wiring board from plating, plating the printed wiring board, applying a first etch resist to the critical portion of the printed wiring board, etching the first conductor of the critical portion of the printed wiring board, removing the first etch resist from the critical portion of the printed wiring board, applying a second etch resist to the printed wiring board including the critical portion of the printed wiring board, etching a second conductor of the printed wiring board, and removing the second etch resist from the printed wiring board.

In further embodiments, the method includes one or more of the following features: the predetermined thickness of the first conductor is typically about 0.7 mils and said etching the first conductor of the critical portion of the printed wiring board comprises etching a dimension of the first conductor to an accuracy within a range of about +/−0.5 mils; said protecting the critical portion of the printed wiring board includes covering the critical portion with plate resist and removing the plate resist after said plating the printed wiring board; the etched first portion of the critical portion of the printed wiring board includes an RF printed filter, and; further including testing the critical portion of the printed wiring board.

In another aspect, a method for manufacturing a printed wiring board includes defining a first area of the printed wiring board requiring a first accuracy of etching, defining a second area of the printed wiring board overlapping with at least a portion of the first area of the printed wiring board, etching a first conductor in the first area of the printed wiring board, and etching a second conductor in the second area of the printed wiring board to an accuracy less than the required first accuracy of etching.

In further embodiments, the method includes one or more of the following features: said etching the first conductor in the first area of the printed wiring board is completed before said etching the second conductor in the second area of the printed wiring board, and said etching the second conductor in the second area of the printed wiring board further includes applying etch resist to the first conductor in the first area of the printed wiring board, and removing etch resist from the first conductor in the first area of the printed wiring board; said etching a second conductor in the second area of the printed wiring board further includes applying plate resist to the first area of the printed wiring board, plating the printed wiring board, and removing plate resist from the first area of the printed wiring board; said etching the first area of the printed wiring board is completed before said etching a second conductor in the second area of the printed wiring board; said etching the first area of the printed wiring board is completed after said etching a second conductor in the second area of the printed wiring board; the first conductor is a conductive layer disposed on printed wiring board and having a thickness of typically about 0.7 mils; the first accuracy of etching is in the range of about +/−0.5 mils; said etching the first area of the printed wiring includes applying an etch resist to the first area of the printed wiring board, etching the first conductor in the first area of the printed wiring board, and removing the etch resist from the first area of the printed wiring board; said etching the second area of the printed wiring board includes applying an etch resist to the printed wiring board, etching the second conductor of the second area of the printed wiring board, and removing the etch resist from the printed wiring board; further including testing the first conductor in the first area of the printed wiring board, and; further including adding interconnections between the first area and the second area of the printed wiring board.

BRIEF DESCRIPTION OF THE DRAWINGS

The foregoing features of the systems and techniques described herein may be more fully understood from the following description of the drawings in which:

FIG. 1A is a flow diagram showing further details of the process of FIG. 1 for completing platings of the PWB;

FIG. 1B is a flow diagram showing further details of the process of FIG. 1 for fine etching in critical portions of the PWB;

FIG. 1C is a flow diagram showing further details of the process of FIG. 1 for etching non-critical portions of the PWB;

FIG. 4 is a cross-sectional view of a PWB of a type which may be manufactured using the techniques described in conjunction with FIGS. 1-4;

FIG. 4A is a top view of a portion of the PWB shown in FIG. 4 taken across lines 4A-4A in FIG. 4; and FIG. 4B is a bottom view of a portion of the PWB shown in FIG. 4 taken across lines 4B-4B in FIG. 4.

DETAILED DESCRIPTION

Figure 1:
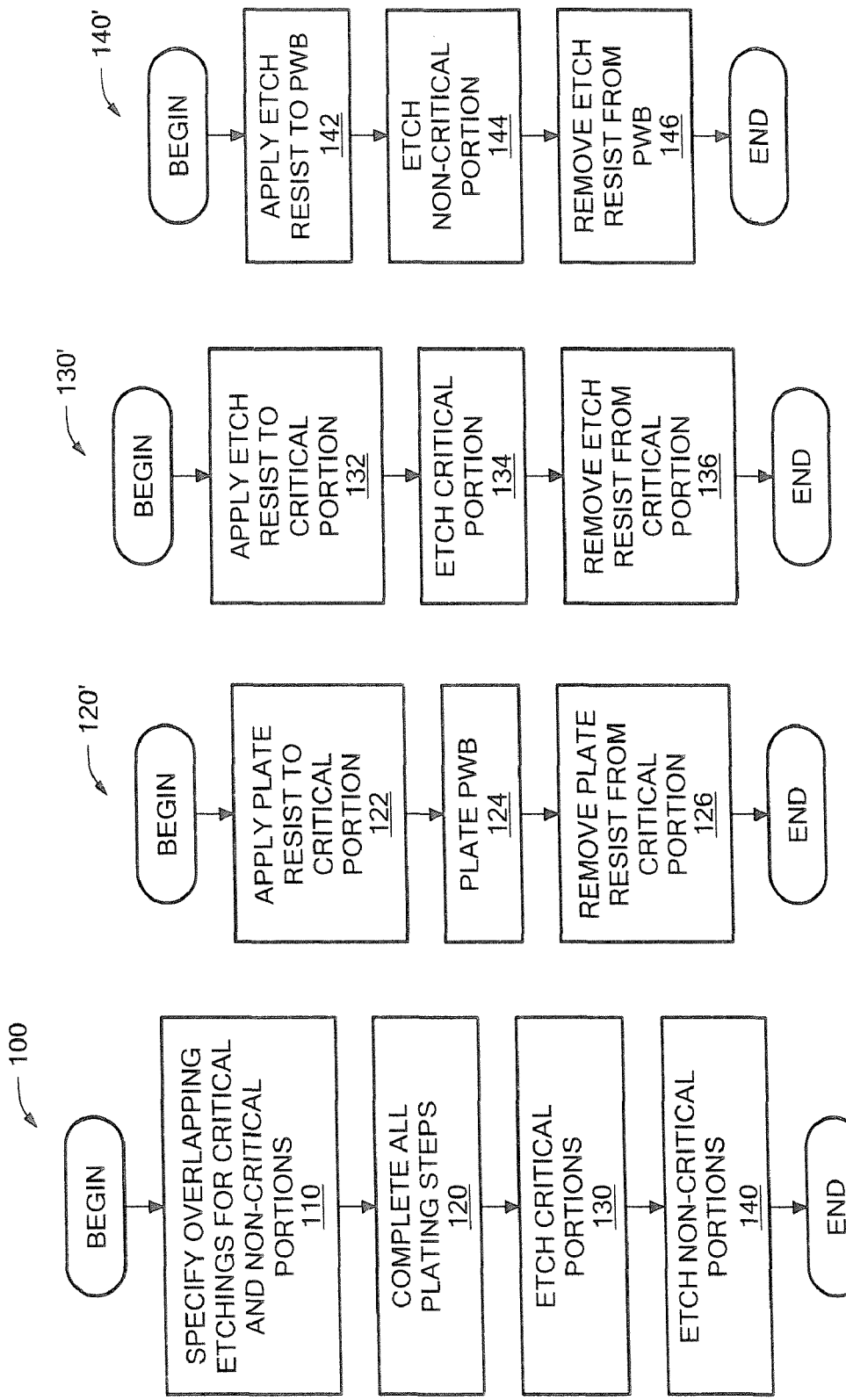
FIG. 1 is a flow diagram of a process for manufacturing a printed wiring board (PWB) having fine etch accuracy in critical portions and multiple platings in non-critical portions of the PWB.

Referring now to FIG. 1, a non-limiting embodiment of a process 100 for manufacturing a printed wiring board (PWB) is shown including process block 110 in which overlapping etchings are specified for critical and non-critical portions of the PWB, block 120 in which multiple plating steps are completed for building the non-critical portion of the PWB, block 130 in which critical portions of the PWB are etched, and block 140 in which non-critical portions of the PWB are etched.

In a further embodiment, block 110 includes specifying a first portion of the PWB corresponding to a so-called critical portion of the PWB meaning that once the PWB is fully fabricated, this portion of the PWB will have disposed thereon one or more printed circuits having one or more dimensions critical to proper or desired PWB operation. The printed circuit may include one or more circuits having critical dimensions required in order for the printed circuit (and therefore, the entire PWB) to function properly. As by way of non-limiting examples, exemplary circuits which may have critical dimensions include but are not limited to a hairpin filter, a radio frequency edge-coupled filter, and/or any other printed circuit with fine-line and/or fine gap etching requirements.

In still further embodiments, block 110 includes specifying a first etch image corresponding to the first portion of the PWB and specifying a second etch image corresponding to a second portion of the PWB.

In some embodiments, block 120 includes completing multiple plating steps to plate up non-critical portions of the PWB. Prior to plating, a plate resist may be applied to the critical portion(s) of the PWB in order to protect the critical portion(s) from plating steps and to maintain the critical portion at a predetermined thickness, as will be described below eliminating the need for sanding and/or planarization steps in the process.

In some embodiments, block 130 includes etching a first conductor in the first portion of the PWB when a first conductor thickness is a predetermined thickness and block 140 includes etching a second conductor in a second portion of the PWB representative of the non-critical portion of the PWB. In some embodiments, the predetermined thickness of the first conductor is about 0.7 mils. The first and second conductors may be comprised of suitable materials known in the art including, but not limited to, conductive metals and conductive non-metals. Suitable conductive metals include, but are not limited to, copper, tin, silver, gold, or combinations thereof. Suitable conductive non-metals include, but are not limited to, graphite, gallium arsenide, and silicon carbide.

It should be noted that the process 100 is not limited to any particular ordering of blocks 110, 120, 130, 140. For example, in some embodiments, block 130 in which the critical portions are etched may be performed before block 120 in which plating steps are completed, and in other embodiments, block 130 may be performed after block 120.

Referring now to FIG. 1A, a more detailed embodiment 120' of process block 120 of FIG. 1 in which all plating steps are completed includes block 122 in which plate resist is applied to the critical portion of the PWB, block 124 in which non-critical portions of the PWB are plated, and block 126 in which plate resist is removed from the critical portions of the PWB. It should be noted that block 124 may include multiple plating steps in which plating material is applied, and sanded and/or planarized until an approximate plating thickness is achieved. As by way of a non-limiting example (and as will be further described below), a first plating step may apply a first layer of plating material at a thickness of about 1 mil and a second plating step may apply a second layer of plating material at a thickness of about 1 mil on top of the first layer of plating material. Successive layers (e.g., a third, fourth, fifth, up to Nth layers) of plating material may be applied, resulting in an overall plating thickness of the non-critical portion of the PWB equal to the sum of all the plating layers. In some embodiments, optional sanding/planarization steps may be included to achieve desired final plating thickness.

It should be well understood by one of ordinary skill in the art that the actual plating thickness may vary from a specified plating thickness due to the inaccuracies of the plating process (e.g. the inaccuracy in plating consistency across the entire surface coupled with planarization and/or the removal of too much or too little plating material). For example, the actual plating thickness may vary up to +/−1 mil from a specified thickness of about 4 mils, resulting in a plating thickness within a range of about 3-5 mils. However, such variations do not affect proper operation of the PWB and therefore are within acceptable plating tolerances. Such variations in thickness may be acceptable in non-critical portions but may be unacceptable in critical portions of the PWB.

Referring now to FIG. 1B, a more detailed embodiment 130' of process block 130 of FIG. 1 in which critical portions of the PWB are etched includes block 132 in which etch resist is applied to the critical portion of the PWB, block 134 in which the critical portion is etched, and block 136 in which etch resist is removed from the critical portion of the PWB.

Referring now to FIG. 10, a more detailed embodiment 140' of process block 140 of FIG. 1 in which non-critical portion of the PWB are etched includes block 142 in which etch resist is applied to the PWB (i.e., to both critical and non-critical portions of the PWB), block 144 in which the non-critical portion is etched, and block 146 in which etch resist is removed from the PWB.

Figure 2:
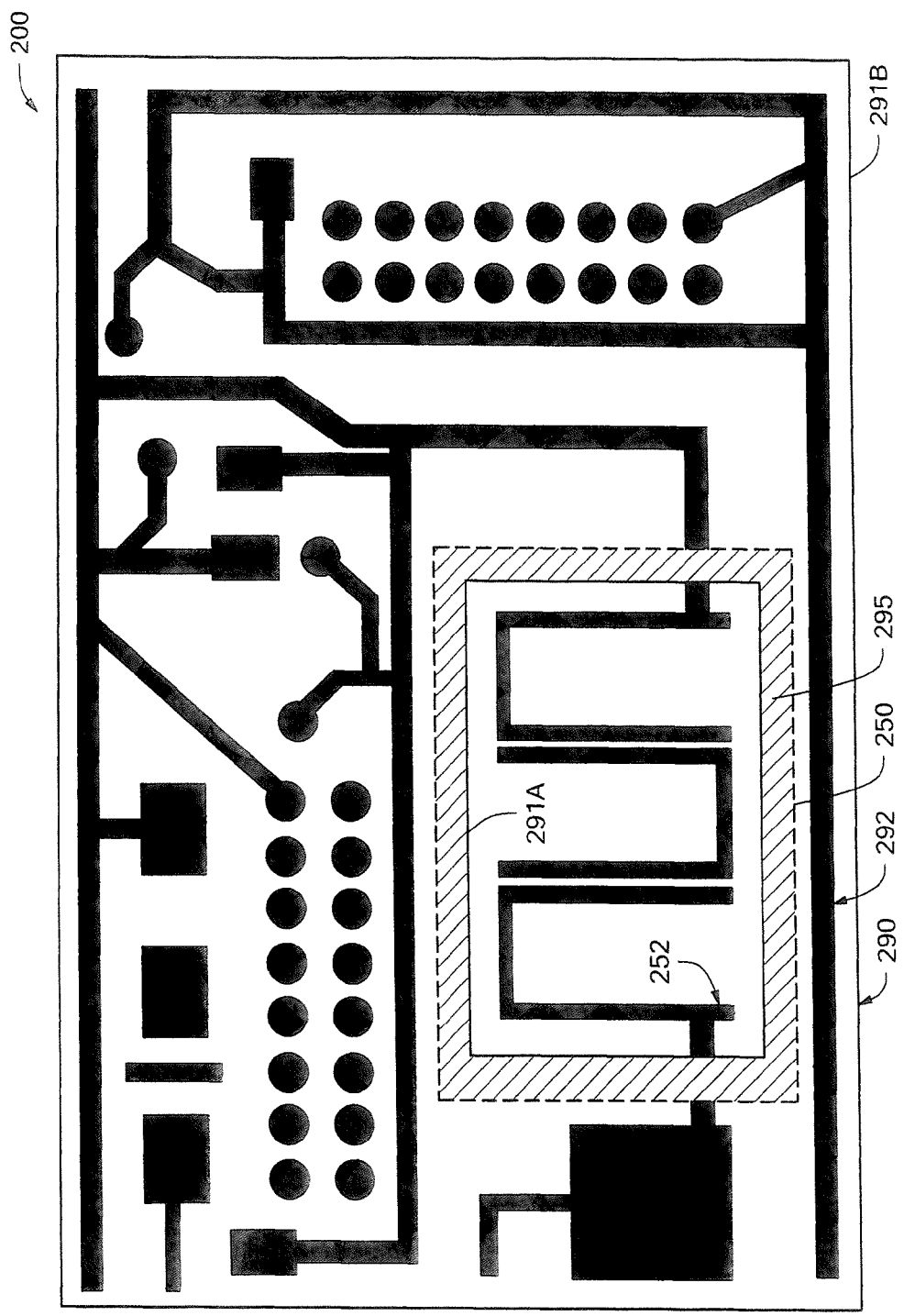
FIG. 2 is a top view of an embodiment of a PWB having critical and non-critical portions.

Referring now to FIG. 2, a pictorial representation of an embodiment of a PWB 200 includes a critical portion 250 of the PWB 200 and a non-critical portion 290 of the PWB 200 (noncritical portion 290 includes all portions of the PWB which are both outside of the region defined by the line denoted by reference numeral 291A and inside the line denoted by reference numeral 291B). Reference numeral 295 denotes a region (shown with hash-marks) in which the critical and non-critical portions of the PWB overlap and hence is referred to as an overlap region 295. The overlap region 295 minimizes and/or eliminates double etching of critical and/or non-critical portions of the PWB and/or other etching problems. For example, the overlap region 295 can eliminate uncontrolled etching problems (e.g., etching distortions) which occur at step regions between high and low plating areas of the PWB, such as when an applied photo-resist sags over the different plating heights of the PWB.

The critical and non-critical portions (250, 290) of the PWB 200 overlap but after etching the circuits, the conductors in each region (i.e. the critical and non-critical regions) are physically and electrically separate from each other. Thus, in the PWB embodiment 200 of FIG. 2, the critical and non-critical portions 250, 290 overlap in region 295. It should be readily apparent to one of ordinary skill in the art, however, that an overlap between the critical and non-critical portion 250, 290 is not limited to such a configuration. That is, although both of the critical and noncritical regions are here shown having rectangular shapes, either or both of the critical and noncritical regions may be provided having round, oval, triangular or irregular shapes in which case, the overlap region could also have any shape.

The critical portion 250 includes a first conductor 252 etched in the critical portion 250 when the first conductor 252 is a predetermined thickness. As can be seen in FIG. 2, the etched first conductor 252 is represented by the black areas of the critical portion 250. The non-critical portion 290 includes a second conductor 292 etched in the non-critical portion 290. As can be seen in FIG. 2, the etched second conductor 292 is represented by the black areas of the non-critical portion 290.

Figure 2A:
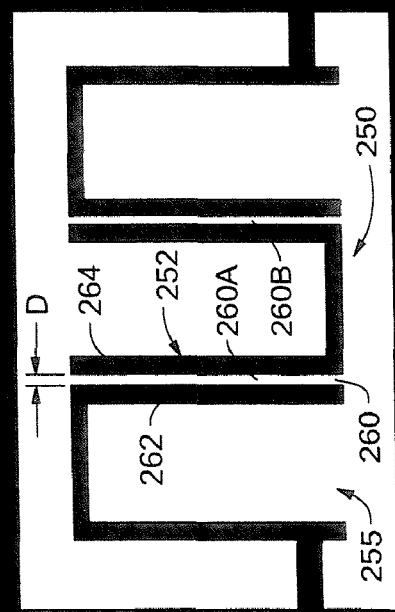
FIG. 2A is a top view of the critical portion of the PWB shown in FIG. 2.

Referring now to FIG. 2A, in which like elements of FIG. 2 are shown with like reference designations, a critical portion 250 includes a first conductor 252 etched to form a printed circuit 255 having a dimension D critical to PWB operation. In the printed circuit embodiment 255 of FIG. 2A, the dimension D corresponds to a width of a gap (generally designated by reference numeral 260) etched in first conductor 252. In a further embodiment, the dimension D may correspond to a width of a plurality of gaps (examples of which are designated by reference numerals 260A, 260B) etched in the first conductor 252.

In a further embodiment, the dimension D is typically about 3 mils. In the same or different embodiment, the gap 260 is formed between conductive paths 262, 264 of the first conductor 252 and extends along at least a portion of the two conductive paths 262, 264. In still a further embodiment, the two conductive paths 262, 264 are parallel. It should be understood that parallel means substantially parallel.

The size of dimension D depends upon the fine-line etching requirements critical to PWB operation. Such fine-line etching requirements will vary depending upon the type of printed circuit 255 that is needed or desired for the PWB. In some embodiments, the first conductor 252 must be etched to specific accuracy for proper PWB operation. For example, in some applications, the first conductor 252 must be etched to within a range of about +/−0.5 mils of the critical dimension D. In order words, in these applications, the first conductor 252 must be etched to an accuracy within a range of about D+0.5 mils to D−0.5 mils.

Figure 2B:
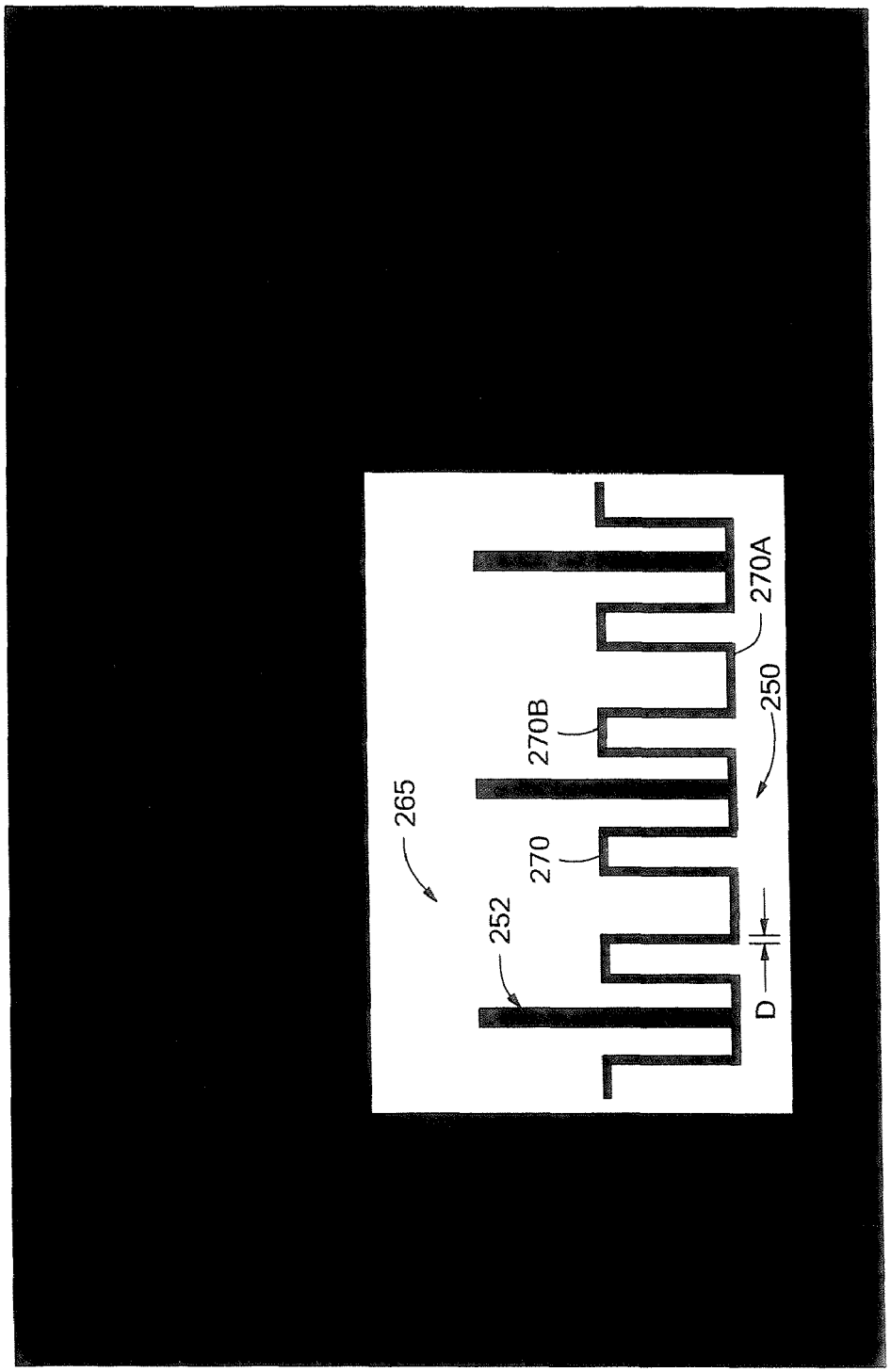
FIG. 2B is a top view of another embodiment of the critical portion of the PWB shown in FIG. 2.

Referring now to FIG. 2B, in which like elements of FIGS. 2 and 2A are shown with like reference designations, another non-limiting example of a printed circuit 265 is shown etched into the first conductor 252 of the critical portion 250 of the PWB 200. Here, a critical dimension D' corresponds to a width of a conductive path 270 of the printed circuit 265. In a further embodiment, the printed circuit 265 includes a plurality of conductive paths (examples of which are designated by reference numerals 270A, 270B), each having a width of D'.

Figure 2C:
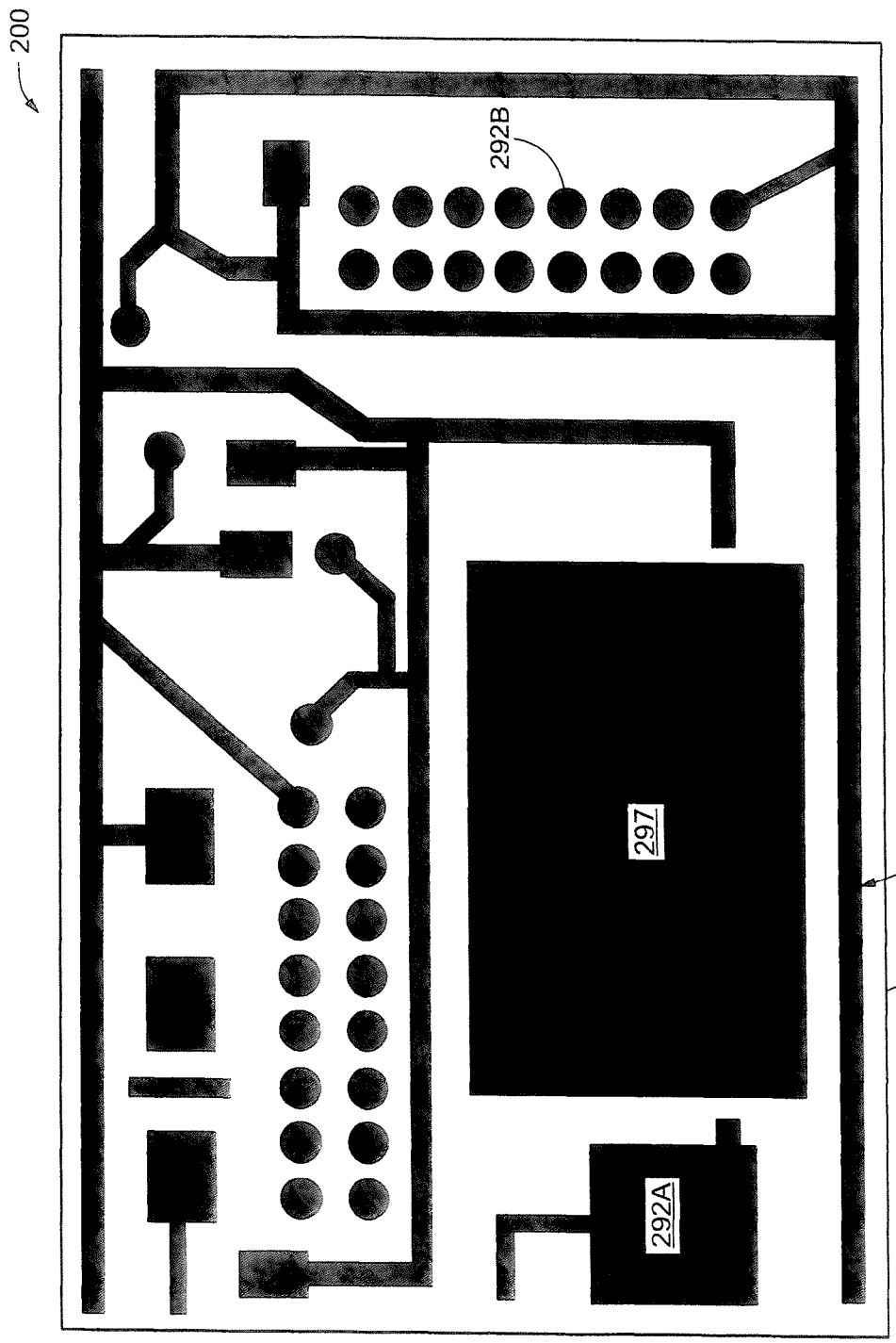
FIG. 2C is a top view of the non-critical portion of the PWB shown in FIG. 2.

Referring now to FIG. 2C, in which like elements of FIG. 2 are shown with like reference designations, a non-critical portion 290 of the PWB 200 includes a second conductor 292. Various board features (examples of which are designated by reference numerals 292A, 292B) are etched into the second conductor 292. As is readily apparent in FIG. 2C, the non-critical portion 290 forms a cut-out portion 297 where no overlap exists between the non-critical portion 290 and the critical portion 250 of the PWB 200.

Figure 3:
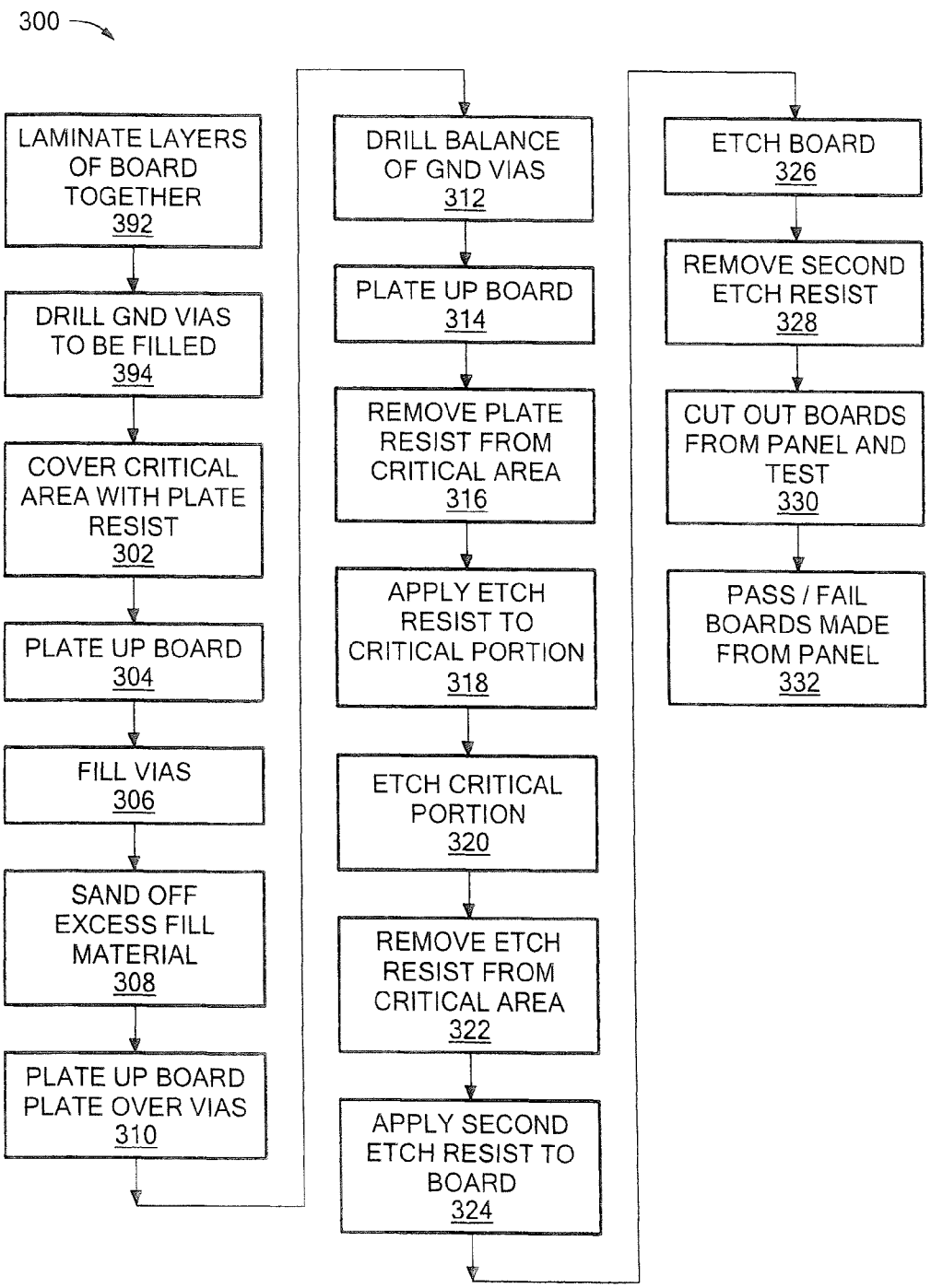
FIG. 3 is a flow diagram of an exemplary process for manufacturing a PWB.

Referring now to FIG. 3, a process 300 is depicted for manufacturing a PWB including a first area of the PWB requiring a first accuracy of etching and a second area of the PWB overlapping with at least a portion of the first area of the PWB. The first area of PWB includes one or more conductors having dimensions which must be fabricated to precise dimensions in order to ensure proper operation of the PWB (i.e. the first area corresponds to a critical portion of the PWB). Thus, the conductors in the first area must be etched to within the first accuracy when the first conductor is a predetermined thickness. The second area of the PWB includes one or more conductors etched to an accuracy less than etching accuracy of the first area of the PWB.

Process 300 begins by laminating layers of the PWB together 392 and drilling ground vias 394 to be filled later. The process proceeds to block 302 in which the first area critical to PWB operation is covered with plate resist. The process 300 includes one or more plating, via drilling, and/or sanding steps (304, 306, 308, 310, 312, 314) to plate up, drill vias, and/or planarize the second area of the PWB non-critical to PWB operation.

For example, in block 304 the PWB is plated up (i.e., a first layer of plating is applied to the PWB). In one embodiment, plating is done to a minimum thickness of about 1 mil. In block 306 any drilled vias are filled with filler material. Next, in block 308, excess fill material is sanded or otherwise removed from the PWB. In block 310 the PWB is plated up (i.e., a second layer of plating is applied to the PWB). In one embodiment, a minimum thickness of about 1 mil is used. In block 312, the balance of ground vias are drilled. In block 314, the PWB is plated up (i.e., a third layer of plating is applied to the PWB) to a minimum thickness of about 1 mil. It should be appreciated that thicknesses less than or more than 1 mil may also be used.

After the PWB is plated up, plate resist is removed from the first area in process block 316. In block 318, etch resist is applied to the first area and in block 320 the first area is etched. In block 322, etch resist is removed from the first area.

It should be noted that etching of the first area designated by process blocks 318, 320, and 322 can be completed before or after the PWB is plated up.

Processing then proceeds to block 324 in which a second etch resist is applied to the PWB, block 326 in which the second area of the PWB is etched, and block 328 in which the second etch resist is removed from the PWB.

In further embodiments, the process 300 includes block 330 in which the PWB is cutout from the manufacturing panel and tested before being populated with discrete parts. In block 332, the PWB is passed or failed based upon test results. In another embodiment, interconnections are added between the first area and the second area of the PWB.

Referring now to FIG. 4, a PWB 400 includes a substrate comprised of upper and lower nonconductive substrate portions 453a, 453b disposed about one or more intervening layers 497 which may include one or both of conductive and nonconductive surfaces. Nonconductive substrate portions 453a, 453b have conductors 452a, 452b, respectively disposed thereover. Thus, conductors 452a, 452b correspond to outermost surfaces (or top and bottom surfaces) of PWB 400. As will be apparent from the description herein below, conductors 452a, 452b have been etched to provide a plurality of individual conductors 452a, 452b which form radio frequency (RF) circuits.

Portions 450, 453 of PWB 400 are designated as critical portions of PWB 400 while portions 490, 491 are designated as non-critical portions of PWB 400. As discussed above in conjunction with FIGS. 1-4, critical PWB portions 450, 453 correspond to those portions of PWB 400 on which conductors 452a, 452b must be etched to a very tight tolerance (i.e. a tolerance greater that a standard tolerance used in etching RF circuits) in order to provide RF circuits with desired operating characteristics. Non-critical PWB portions 490, 491, on the other hand, correspond to those portions of PWB 400 on which conductors 452a, 452b need not be etched to a very tight tolerance (i.e. a standard tolerance can be used) in order to provide RF circuits with desired operating characteristics. One or more plating layers 492a-492c are disposed over conductors 452a, 452b in the non-critical portions 490, 491 of PWB 400.

It should be appreciated that those portions of PWB 400 identified as critical portions 450, 453 are separate from and overlapping with non-critical portions 490, 491, respectively. The critical portion 450 includes a portion of a conductor 452 and the non-critical portion 490 includes a different portion of the conductor 452 as well as multiple electro-platings (generally denoted by reference numeral 492). In one embodiment, conductors 452a, 452b may be laminated to non-conductive substrates 453a, 453b using an epoxy resin prepreg.

In the exemplary PWB 400 of FIG. 4, non-critical portion 490 further includes a first plating layer 492A, a second plating layer 492B, and a third plating layer 492C. As can be seen in FIG. 4, the PWB 400 may optionally include a via 457 which has been plated and subsequently filled with either a conductive or non-conductive material. During plating of the PWB, a plate resist 451 is applied to the critical portion 450 in order to protect the critical portion 450 from the plating. The plate resist 451 is removed after completion of the plating to reveal unplated conductors in critical PWB portion 450. It should be noted that although three plating layers 492A, 492B, 492C are shown, any number of plating layers (i.e., one, two, four, five, 10, etc.) may be applied depending on the PWB application.

In some embodiments, the conductor 452 has a predetermined thickness t typically of about 0.7 mils. In further embodiments, each of the first, second, and third plating layers (492 Am 492B, 492C) has a thickness typically of about 1 mil. In this way, the critical area 450 has a thickness equal to the predetermined thickness t of the conductor 452 (i.e., about 0.7 mils) and the non-critical area 490 has a thickness equal to the total of the thicknesses of the conductor 452 and the three plating layers (i.e., about 4 mils).

Referring now to FIG. 4A, in critical portion 450, conductor 452a has been etched to form a printed circuit 455 (which may be the same as or similar to printed circuit 255 described in conjunction with FIG. 2A). Printed circuit 455 has a dimension 456 critical to the operation of the PWB 400. Here, the dimension 456 corresponds to a width of a gap 460 between conductors 462, 464 of the printed circuit 455. In some embodiments, the width of the gap 460 is typically about 3 mils. Furthermore, the gap is etched to an accuracy within a range of about +/−0.5 mil, resulting in a gap width that may range from about 2.5-3.5 mils.

The non-critical portion 490 includes various PWB features etched to an accuracy less than the accuracy required for the critical portion 450. For example, when the accuracy of the critical portion 450 is within a range of about +/−0.5 mils, the various PWB features in the non-critical portion 490 may be etched to an accuracy within a range of at least about +/−2.5 mils of a specified dimension.

In a further embodiment, PWB 400 includes intervening layers generally denoted by reference numeral 497. In another embodiment, the critical portion 450 and the non-critical portion 490 are etched on a first side 415 of the PWB 400, and the PWB 400 further includes a second critical portion 453 and a second non-critical portion 491 etched on a second side 425 of the PWB 400 opposing the first side 415 of the PWB 400. The second critical area 453 includes a second printed circuit 457 that may be of the same or different type as the printed circuit 455 on the first side 415 of the PWB 400. For example, in embodiments in which the second printed circuit 457 is different than the printed circuit 455 on the first side 415 of the PWB 400, the second printed circuit 457 may be similar to the printed circuit embodiment described in conjunction with FIG. 2B. In still another embodiment, the second printed circuit 457 has a critical dimension 459 that is different than the critical dimension 456.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A method of manufacturing a printed wiring board having a conductor disposed on a surface thereof, the method comprising:

applying a protective coating to at least a critical portion of the printed wiring board to protect the conductor in the critical portion of the printed wiring board from plating wherein the critical portion of the printed wiring board corresponds to a region of the printed wiring board requiring tolerances which are tighter than tolerances required in other regions of the printed wiring board;

plating the conductor of the printed wiring board in regions other than the critical portion of the printed wiring board;

removing the protective coating from the critical portion of the printed wiring board;

applying a first etch resist to the critical portion of the printed wiring board;

etching the first conductor in the critical portion of the printed wiring board;

removing the first etch resist from the critical portion of the printed wiring board;

applying a second etch resist to the printed wiring board including the critical portion of the printed wiring board;

etching the plated conductor of the printed wiring board; and removing the second etch resist from the printed wiring board.

2. The method of claim 1, wherein the thickness of the conductor is typically about 0.7 mils and said etching the conductor in the critical portion of the printed wiring board comprises etching a dimension of the first conductor to an accuracy within a range of about +/−0.5 mils.

3. The method of claim 1, wherein applying a protective coating comprises:

covering the critical portion of the printed wiring board with plate resist and removing the plate resist after said plating the conductor of the printed wiring board in regions other than the critical portion of the printed wiring board.

4. The method of claim 1, wherein etching the first conductor in the critical portion of the printed wiring board comprises etching the first conductor in the critical portion of the printed wiring board to provide an RF printed filter.

5. The method of claim 1, further comprising:

testing the critical portion of the printed wiring board.

6. The process of claim 1, wherein:

etching the conductor in the critical portion of the printed wiring board is completed before plating the conductor in of the printed wiring board in regions other than the critical portion of the printed wiring board; and said etching the plated conductor in the regions of the printed wiring board other than the critical portion of the printed wiring board is completed after completing the plating.

7. The process of claim 1, wherein:

said etching the conductor in the critical portion of the printed wiring board is completed after plating the conductor in of the printed wiring board in regions other than the critical portion of the printed wiring board; and said etching the plated conductor of the regions of the printed wiring board other than the critical portion of the printed wiring board is completed after completing the plating.

8. The process of claim 4, wherein the RF printed filter corresponds to an RF edge-coupled filter.

9. A method for manufacturing a printed wiring board having a conductor disposed on a surface thereof, the method comprising:

applying a plate resist to the conductor in a first area of the printed wiring board requiring a first accuracy of etching;

plating the conductor in a second area of the printed wiring board;

removing the plate resist from the first area of the printed wiring board;

applying a first etch resist to the conductor in the first area of the printed wiring board;

etching the conductor in the first area of the printed wiring board; and removing the etch resist from the first area of the printed wiring board;

applying a second etch resist to the plated conductor in the second area of the printed wiring board;

etching the plated conductor in the second area of the printed wiring board to an accuracy less than the required first accuracy of etching.

10. The method of claim 9, wherein etching the conductor in the first area of the printed wiring board is completed before etching the plated conductor in the second area of the printed wiring board, and said etching the plated conductor in the second area of the printed wiring board further comprises:

applying etch resist to the conductor in the first area of the printed wiring board; and removing etch resist from the conductor in the first area of the printed wiring board.

11. The method of claim 9, wherein etching the plated conductor in the second area of the printed wiring board further comprises:

applying plate resist to the first area of the printed wiring board;

plating the printed wiring board; and removing plate resist from the first area of the printed wiring board.

12. The method of claim 11, wherein said etching the first area of the printed wiring board is completed before etching the plated conductor in the second area of the printed wiring board.

13. The method of claim 11, wherein said etching the first area of the printed wiring board is completed after etching the plated conductor in the second area of the printed wiring board.

14. The method of claim 9, wherein the first conductor is a conductor layer disposed on printed wiring board and having a thickness of typically about 0.7 mils.

15. The method of claim 9, wherein the first accuracy of etching is in the range of about +/−0.5 mils.

16. The method of claim 9, wherein etching the first area of the printed wiring board comprises:

applying an etch resist to the first area of the printed wiring board;

etching the conductor in the first area of the printed wiring board; and removing the etch resist from the first area of the printed wiring board.

17. The method of claim 9, wherein etching the second area of the printed wiring board comprises:

applying an etch resist to the printed wiring board;

etching the plated conductor of the second area of the printed wiring board; and removing the etch resist from the printed wiring board.

18. The method of claim 9, further comprising:

testing the conductor in the first area of the printed wiring board.

19. The method of claim 18, further comprising:

adding interconnections between the first area and the second area of the printed wiring board.

\* \* \* \* \*